United States Patent
Shim et al.

(10) Patent No.: US 9,644,077 B2
(45) Date of Patent: May 9, 2017

(54) METHOD FOR FORMING QUANTUM DOT THIN FILM

(71) Applicant: KOREA INSTITUTE OF MACHINERY & MATERIALS, Daejeon (KR)

(72) Inventors: Hyung-Cheoul Shim, Daejeon (KR); So-Hee Jeong, Daejeon (KR); Won-Seok Chang, Daejeon (KR)

(73) Assignee: Korea Institute of Machinery & Materials, Daejeon (KR)

( * ) Notice: Subject to any disclaimer, the term of this patent is extended or adjusted under 35 U.S.C. 154(b) by 0 days.

(21) Appl. No.: 15/109,546

(22) PCT Filed: Dec. 9, 2014

(86) PCT No.: PCT/KR2014/012071
§ 371 (c)(1),
(2) Date: Jul. 1, 2016

(87) PCT Pub. No.: WO2015/194721
PCT Pub. Date: Dec. 23, 2015

(65) Prior Publication Data
US 2016/0326326 A1   Nov. 10, 2016

(30) Foreign Application Priority Data
Jun. 20, 2014  (KR) ........................ 10-2014-0075962

(51) Int. Cl.
*B05D 5/12* (2006.01)
*C08J 7/06* (2006.01)
(Continued)

(52) U.S. Cl.
CPC ................ *C08J 7/06* (2013.01); *B05D 1/005* (2013.01); *B05D 1/02* (2013.01); *B05D 1/18* (2013.01);
(Continued)

(58) Field of Classification Search
CPC combination set(s) only.
See application file for complete search history.

(56) References Cited

U.S. PATENT DOCUMENTS

| 4,883,561 A | 11/1989 | Gmitter et al. |
| 2007/0210300 A1* | 9/2007 | Kawaguchi ............ B82Y 20/00 257/14 |

(Continued)

FOREIGN PATENT DOCUMENTS

KR  10-2012-0017399 A   2/2012

OTHER PUBLICATIONS

Prosser et al., "Avoiding Cracks in Nanoparticle Films", Nano Letters, Sep. 17, 2012, pp. 5287-5291 vol. 12.

(Continued)

*Primary Examiner* — Austin Murata
(74) *Attorney, Agent, or Firm* — Hauptman Ham, LLP

(57) ABSTRACT

A method for manufacturing a quantum dot thin film includes applying a tensile force to a substrate to elongate the substrate, coating a quantum dot particle on the substrate to form a quantum dot thin film, replacing a ligand of the quantum dot particle, and removing the tensile force from the substrate. The method may reduce a crack in a quantum dot thin film.

8 Claims, 5 Drawing Sheets

(51) Int. Cl.
   *B82B 3/00*    (2006.01)
   *B05D 1/00*    (2006.01)
   *B05D 1/02*    (2006.01)
   *B05D 1/18*    (2006.01)

(52) U.S. Cl.
   CPC ............ *B82B 3/00* (2013.01); *C08J 2323/06* (2013.01); *C08J 2323/12* (2013.01); *C08J 2367/00* (2013.01); *C08J 2367/02* (2013.01); *C08J 2375/04* (2013.01); *C08J 2377/00* (2013.01); *C08J 2379/08* (2013.01); *C08J 2383/04* (2013.01)

(56) References Cited

U.S. PATENT DOCUMENTS

2012/0045689 A1     2/2012  Okabe et al.
2016/0035919 A1*    2/2016  Suh ................ H01L 31/035218
                                                    136/255

OTHER PUBLICATIONS

Romano et al., "Effect of Si doping on strain, cracking, and microstructure in GaN thin films grown by metalorganic chemical vapor deposition", Journal of Applied Physics, Jun. 1, 2000, pp. 7745-7752, vol. 87.
International Search Report mailed Mar. 17, 2015 in International Application No. PCT/KR2014/012071, filed Dec. 9, 2014.

* cited by examiner

METHOD FOR FORMING QUANTUM DOT THIN FILM

RELATED APPLICATIONS

The present application is a National Phase of International Application Number PCT/KR2014/012071, filed Dec. 9, 2014, and claims priority from Korea Application Number 10-2014-0075962, filed Jun. 20, 2014.

BACKGROUND

1. Field

The present invention relates to a quantum dot thin film. More particularly, the present invention relates to a method for forming a quantum dot thin film, which is capable of preventing a crack therein.

2. Description of the Related Art

A quantum dot is a nano-particle having semiconductive properties and having a size less than tens of nanometers. The quantum dot has properties different from a bulk particle due to quantum confinement effect. For example, the quantum dot can change a wavelength of a light, which the quantum dot absorbs, according to a size thereof. Furthermore, the quantum dot has novel optical, electrical and physical properties that the bulk particle does not have. Thus, researches are being conducted for manufacturing a photoelectric conversion device such as a solar cell, a light-emitting diode or the like.

In order to apply the quantum dot to a device, forming a quantum dot thin film may be required. A quantum dot particle is formed to have a ligand combined therewith. In order to form a quantum dot thin film, a quantum dot particle may be coated on a substrate and treated to replace a shorter ligand with the initial ligand so that the thin film may have a conductivity. In the process of replacing the ligands, a crack may be formed in the thin film because of volume contraction of the thin film.

SUMMARY

The present invention provides a method for forming a quantum dot thin film capable of preventing and/or reducing a crack therein.

According to an exemplary embodiment, a method for manufacturing a quantum dot thin film includes applying a tensile force to a substrate to elongate the substrate, coating a quantum dot particle on the substrate to form a quantum dot thin film, replacing a ligand of the quantum dot particle, and removing the tensile force from the substrate.

In an exemplary embodiment, the substrate includes a polymer, for example, polyester terephthalate, polyamide, polydimethyl siloxane, polyester, polyethylene, polypropylene, polyimide, or polyurethane.

In an exemplary embodiment, the quantum dot particle includes a compound of Group 13 and Group 15, a compound of Group 12 and Group 16 or a compound of Group 14 and Group 16.

In an exemplary embodiment, the quantum dot particle includes a first ligand before replacing the ligand, and includes a second ligand having carbon atoms less than the first ligand after replacing the ligand. In order to replacing the ligand of the quantum dot particle, alcane thiol, hydrazine or hydroxyl amine is provided to the quantum dot particle.

In an exemplary embodiment, an elongation percentage of the substrate is 0.1% to 10%.

In an exemplary embodiment, the substrate is heated at 40° C. to 100° C. after replacing the ligand of the quantum dot particle.

According to the exemplary embodiments, a crack in a quantum dot thin film may be prevented or reduced through a simple method applying a tensile force to a substrate and removing the tensile force after forming a quantum dot thin film. Thus, electrical properties of the quantum dot thin film may be increased.

DETAILED DESCRIPTION

Figure 1:
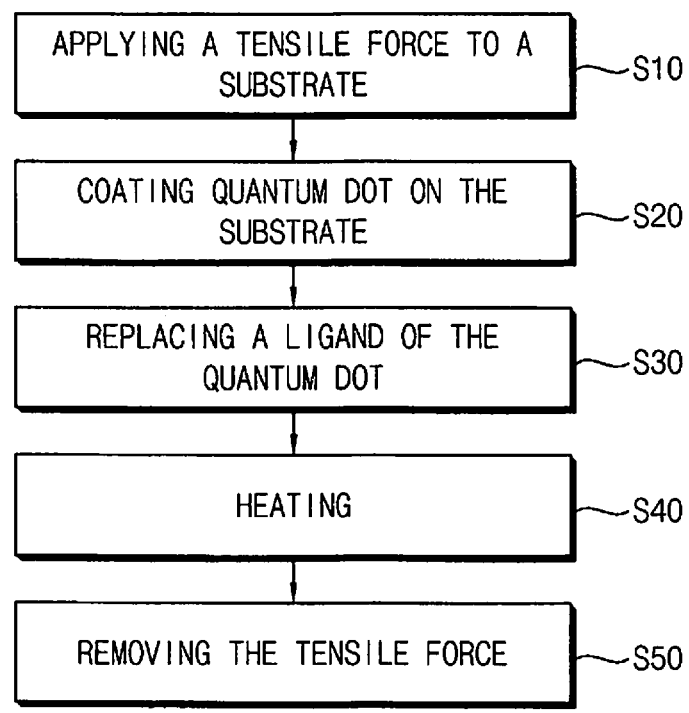
FIG. 1 is a flow-chart for explaining a method for forming a quantum dot thin film according to an exemplary embodiment of the present invention.

Example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity. It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 5:
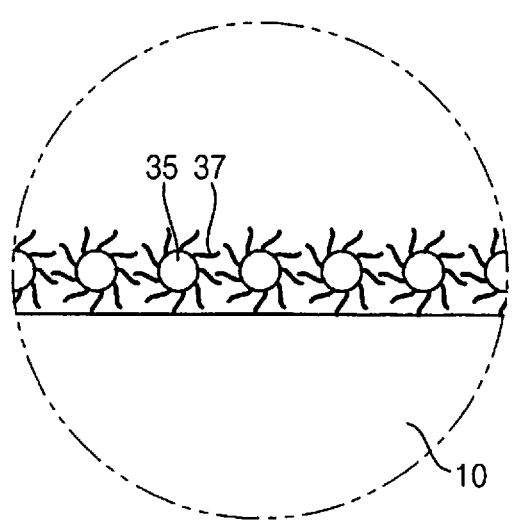
FIGS. 5, 6 and 8 are enlarged cross-sectional views illustrating a quantum dot particle in a quantum dot thin film formed according to an exemplary embodiment of the present invention.
Figure 6:
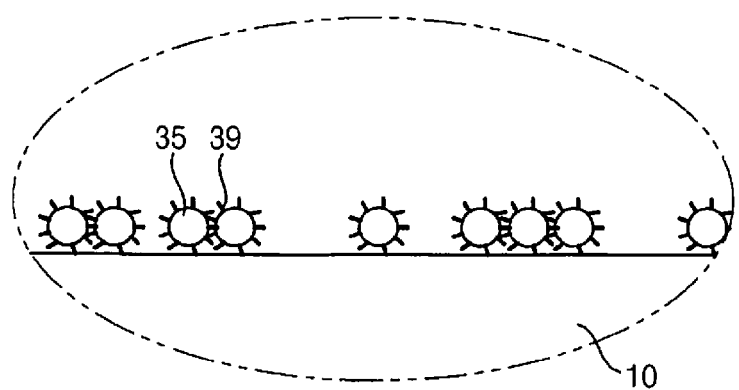

FIG. 1 is a flow-chart for explaining a method for forming a quantum dot thin film according to an exemplary embodiment of the present invention. FIGS. 2 to 4 and 7 are perspective views illustrating a method for forming a quantum dot thin film according to an exemplary embodiment of the present invention. FIGS. 5, 6 and 8 are enlarged cross-sectional views illustrating a quantum dot particle in a quantum dot thin film formed according to an exemplary embodiment of the present invention.

Figure 2:
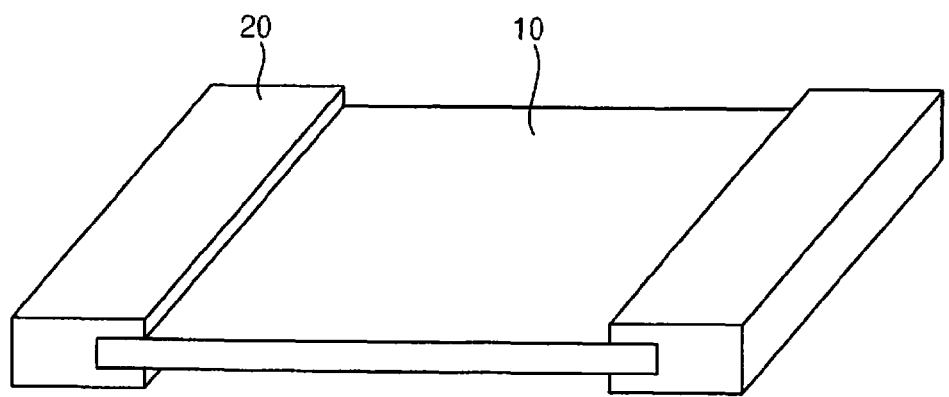
FIGS. 2 to 4 and 7 are perspective views illustrating a method for forming a quantum dot thin film according to an exemplary embodiment of the present invention.
Figure 3:
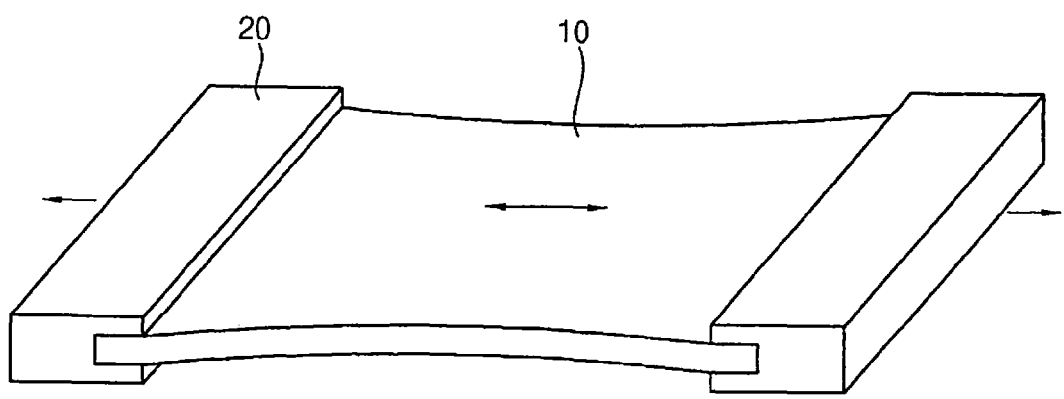

Referring to FIGS. 1 to 3, a tensile force is applied to a substrate 10 (S10). The substrate preferably includes a polymer. The substrate including a polymer may have a relatively larger resilience than glass, silicon or the like. Thus, the substrate may be advantageous in a restoring process that will be explained in the following. Examples of the polymer may include polyester terephthalate, polyamide, polydimethyl siloxane, polyester such as Echoflex™, polyethylene, polypropylene, polyimide, polyurethane or the like. Preferably, polyimide, polyurethane and polyester may be used in view of elongation, chemical resistance, heat resistance or the like.

A tensile force is applied to the substrate in a direction parallel to the substrate. For example, the tensile force may be applied to the substrate such than an elongation percentage of the substrate may be 0.1% to 10%. When the elongation percentage of the substrate is excessively large, variation of a surface area of the substrate is large after the tensile force is removed. Thus, a quantum dot thin film may be damaged. When the elongation percentage of the substrate is excessively small, a gap between quantum dot particles may be hardly reduced so that an effect of preventing a crack is little. In the following processes, the tensile force applied to the substrate is maintained until the tensile force is removed.

An elongation apparatus may be used for applying a tensile force to the substrate. For example, the elongation apparatus may include fixing parts 20 that secures both ends of the substrate. The fixing parts 20 may move such that the fixing parts 20 may be farther from each other to elongate the substrate.

Figure 4:
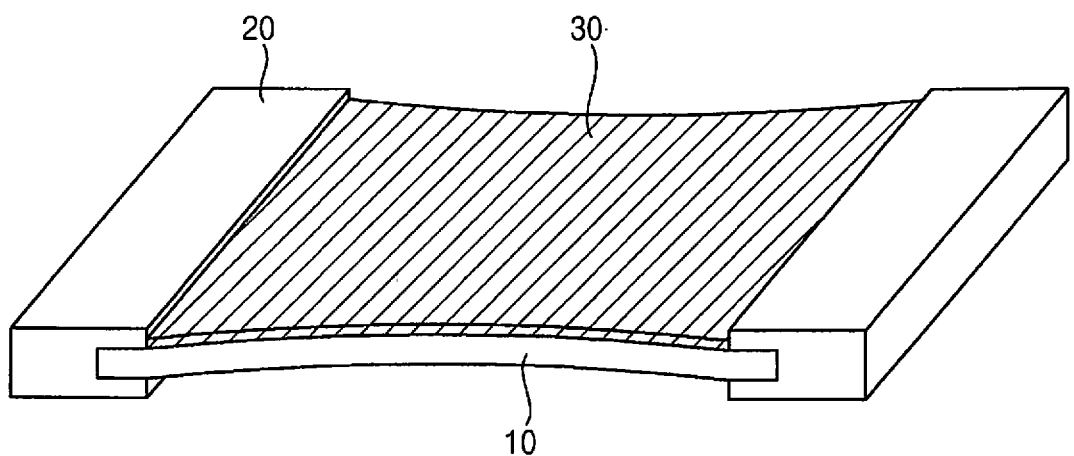

Referring to FIGS. 1 and 4, a quantum dot particle is coated on the elongated substrate (S20). Thus, a quantum dot thin film 30 is formed.

The quantum dot particle may have a diameter of about 1 nm to about 100 nm, and preferably, about 1 nm to about 20 nm.

For example, the quantum dot may include a compound of Group 14 and Group 16 (in the periodic table). For example, the quantum dot may include tin oxide (SnO), tin sulfide (SnS), tin selenide (SnSe), tin telluride (SnTe), lead sulfide (PbS), lead selenide (PbSe), lead telluride (PbTe), germanium oxide (GeO), germanium sulfide (GeS), germanium selenide (GeSe), germanium telluride (GeTe), tin selenium sulfide (SnSeS), tin selenium telluride (SnSeTe), tin sulfide telluride (SnSTe), lead selenium sulfide (PbSeS), lead selenium telluride (PbSeTe), lead sulfide telluride (PbSTe), tin lead sulfide (SnPbS), tin lead selenide (SnPbSe), tin lead telluride (SnPbTe), tin oxide sulfide (SnOS), tin oxide selenide (SnOSe), tin oxide telluride (SnOTe), germanium oxide sulfide (GeOS), germanium oxide selenide (GeOSe), germanium oxide telluride (GeOTe), tin lead sulfide selenide (SnPbSSe), tin lead selenium telluride (SnPbSeTe), tin lead sulfide telluride (SnPbSTe) or the like. Theses may be used each alone or in a combination thereof.

In another embodiment, the quantum dot may include a compound of Group 12 and Group 16. For example, the quantum dot may include cadmium sulfide (CdS), cadmium selenide (CdSe), cadmium telluride (CdTe), zinc sulfide (ZnS), zinc selenide (ZnSe), zinc telluride (ZnTe), mercury sulfide (HgS), mercury selenide (HgSe), mercury telluride (HgTe), zinc oxide (ZnO), cadmium oxide (CdO), mercury oxide (HgO), cadmium selenium sulfide (CdSeS), cadmium selenium telluride (CdSeTe), cadmium sulfide telluride (CdSTe), cadmium zinc sulfide (CdZnS), cadmium zinc selenide (CdZnSe), cadmium sulfide selenide (CdSSe), cadmium zinc telluride (CdZnTe), cadmium mercury sulfide (CdHgS), cadmium mercury selenide (CdHgSe), cadmium mercury telluride (CdHgTe), zinc selenium sulfide (ZnSeS), zinc selenium telluride (ZnSeTe), zinc sulfide telluride (ZnSTe), mercury selenium sulfide (HgSeS), mercury selenium telluride (HgSeTe), mercury sulfide telluride (HgSTe), mercury zinc sulfide (HgZnS), mercury zinc selenide (HgZnSe), cadmium zinc oxide (CdZnO), cadmium mercury oxide (CdHgO), zinc mercury oxide (ZnHgO), zinc selenium oxide (ZnSeO), zinc tellurium oxide (ZnTeO), zinc sulfide oxide (ZnSO), cadmium selenium oxide (CdSeO), cadmium tellurium oxide (CdTeO), cadmium sulfide oxide (CdSO), mercury selenium oxide (HgSeO), mercury tellurium oxide (HgTeO), mercury sulfide oxide (HgSO), cadmium zinc selenium sulfide (CdZnSeS), cadmium zinc selenium telluride (CdZnSeTe), cadmium zinc sulfide telluride (CdZnSTe), cadmium mercury selenium sulfide (CdHgSeS), cadmium mercury selenium telluride (CdHgSeTe), cadmium mercury sulfide telluride (CdHgSTe), mercury zinc selenium sulfide (HgZnSeS), mercury zinc selenium telluride (HgZnSeTe), mercury zinc sulfide telluride (HgZnSTe), cadmium zinc selenium oxide (CdZnSeO), cadmium zinc tellurium oxide (CdZnTeO), cadmium zinc sulfide oxide (CdZnSO), cadmium mercury selenium oxide (CdHgSeO), cadmium mercury tellurium oxide (CdHgTeO), cadmium mercury sulfide oxide (CdHgSO), zinc mercury selenium oxide (ZnHgSeO), zinc mercury tellurium oxide (ZnHgTeO), zinc mercury sulfide oxide (ZnHgSO) or the like. Theses may be used each alone or in a combination thereof.

In another embodiment, the quantum dot may include a compound of Group 13 and Group 15. For example, the quantum dot may include gallium phosphide (GaP), gallium arsenide (GaAs), gallium antimonide (GaSb), gallium nitride (GaN), aluminum phosphide (AlP), aluminum arsenide (AlAs), aluminum antimonide (AlSb), aluminum nitride (AlN), indium phosphide (InP), indium arsenide (InAs), indium antimonide (InSb), indium nitride (InN), gallium phosphide arsenide (GaPAs), gallium phosphide antimonide (GaPSb), gallium phosphide nitride (GaPN), gallium arsenide nitride (GaAsN), gallium antimonide nitride (GaSbN), aluminum phosphide arsenide (AlPAs), aluminum phosphide antimonide (AlPSb), aluminum phosphide nitride (AlPN), aluminum arsenide nitride (AlAsN), aluminum antimonide nitride (AlSbN), indium phosphide arsenide (InPAs), indium phosphide antimonide (InPSb), indium phosphide nitride (InPN), indium arsenide nitride (InAsN), indium antimonide nitride (InSbN), aluminum gallium phosphide (AlGaP), aluminum gallium arsenide (AlGaAs), aluminum gallium antimonide (AlGaSb), aluminum gallium nitride (AlGaN), aluminum arsenide nitride (AlAsN), aluminum antimonide nitride (AlSbN), indium gallium phosphide (InGaP), indium gallium arsenide (InGaAs), indium gallium antimonide (InGaSb), indium gallium nitride (InGaN), indium arsenide nitride (InAsN), indium antimonide nitride (InSbN), aluminum indium phosphide (AlInP), aluminum indium arsenide (AlInAs), aluminum indium antimonide (AlInSb), aluminum indium nitride (AlInN), aluminum arsenide nitride (AlAsN), aluminum antimonide nitride (AlSbN), aluminum phosphide nitride (AlPN), gallium aluminum phosphide arsenide (GaAoPAs), gallium aluminum phosphide antimonide (GaAlPSb), gallium indium phosphide arsenide (GaInPAs), gallium indium aluminum arsenide (GaInAlAs), gallium aluminum phosphide nitride (GaAlPN), gallium aluminum arsenide nitride (GaAlAsN), gallium aluminum antimonide nitride (GaAlSbN), gallium indium phosphide nitride (GaInPN), gallium indium arsenide nitride (GaInAsN), gallium indium aluminum nitride (GaInAlN), gallium antimonide phosphide nitride (GaSbPN), gallium arsenide phosphide nitride (GaAsPN), gallium arsenide antimonide nitride (GaAsSbN), gallium indium phosphide antimonide (GaInPSb), gallium indium phosphide nitride (GaInPN), gallium indium antimonide nitride (GaInSbN), gallium phosphide antimonide nitride (GaPSbN), indium aluminum phosphide arsenide (InAlPAs), indium aluminum phosphide nitride (InAlPN), indium phosphide arsenide nitride (InPAsN), indium aluminum antimonide nitride (InAlSbN), indium phosphide antimonide nitride (InPSbN), indium arsenide antimonide nitride (InAsSbN), indium aluminum phosphide antimonide (InAlPSb) or the like. Theses may be used each alone or in a combination thereof.

The quantum dot particle may be prepared according to a conventional method for forming a quantum dot particle. For example, a lead sulfide quantum dot particle may be prepared by the following: $Pb(C_2H_3O_2)_2.3H_2O$ and oleic acid may be mixed with each other in octadecene (ODE) and heated in a vacuum. Thereafter, ODE is added thereto. Thereafter, bis(trimethylsily)sulfide is injected, and a reaction solution is cooled by toluene. The cooled solution is injected in a mixture solution including butanol and methanol to induce crystallization reaction.

A lead selenide quantum dot particle may be prepared by the following: $Pb(C_2H_3O_2)_2.3H_2O$ and oleic acid may be mixed with each other in octadecene (ODE) and heated in a vacuum. Thereafter, TOP-Se (Trioctylphosphine-Se) is added thereto in a room temperature. Thereafter, a reaction solution is mixed with a mixture of 1,2-hexadecanediol and ODE, and cooled by toluene. The cooled solution is injected in a mixture solution including butanol and methanol to induce crystallization reaction.

A quantum dot particle 35 prepared by the above may have a first ligand 37 combined therewith as illustrated in FIG. 5. For example, the quantum dot particle 35 may be combined with oleic acid as a ligand. The quantum dot particle may be dispersed in butanol, methanol, hexane or a mixture thereof.

Coating the quantum dot particle may be performed by dipping, spraying, drop-casting, self-assembling, spin-coating, doctor-blade, printing or the like. In an exemplary embodiment, dipping may be preferably used. Dipping may be simply performed without using an additional apparatus. Furthermore, a monolayer or a multilayer may be easily formed through adjusting concentration of quantum dot. Furthermore, other methods may require high concentration of quantum dot or long-time exposure. Dipping may form a quantum dot thin film through layer-by-layer assembly and may prevent problem of crystallization criticality. Thus, loss or distortion, which is generated when electrons move in a quantum dot thin film, may be prevented. For example, the substrate may be dipped in a mixture solution including quantum dot particles and alcohol for seconds or tens of seconds, and then taken out.

Thereafter, a ligand of the quantum dot particle may be replaced (S30). A replacement ligand replacing a previous ligand may be preferably a material that is able to be strongly combined with the quantum dot and has a size smaller than the previous ligand. For example, the replacement ligand may be an organic material having carbon atoms equal to or less than 3, and may preferably have carbon atoms of 1 or 2. Particularly, the replacement ligand may be alcane thiol such as ethane thiol or ethane dithiol, hydrazine, hydroxyl amine or the like. The replacement ligand may be selected depending on a quantum dot. For example, a ligand including a thiol group may be preferably used for a quantum dot including lead such as lead sulfide, lead selenide or the like. A ligand including a hydroxyl group may be preferably used for indium phosphide quantum dot. The above-mentioned materials have short length and may be strongly combined with a quantum dot.

Accordingly, the quantum dot particle is combined with a second ligand 39 that is shorter than the first ligand 39 as illustrated in FIG. 6. In the process of replacing the ligand, a gap between quantum dot particles may be formed.

Replacing the ligands may be performed by dipping, spraying, drop-casting, self-assembling, spin-coating, doctor-blade, printing or the like. In an exemplary embodiment, dipping may be preferably used.

Thereafter, the substrate including the quantum dot particle having a replaced ligand is heated (S40). The heating process may be performed at about 40° C. to about 100° C.

Electrical properties of a quantum dot thin film may be improved through the heating process. In the heating process, quantum dot particles adhere to each other. Thus, an electron bond energy is increased, and a volume of the quantum dot thin film is reduced. Furthermore, a gap between the quantum dot particles may be increased.

Figure 7:
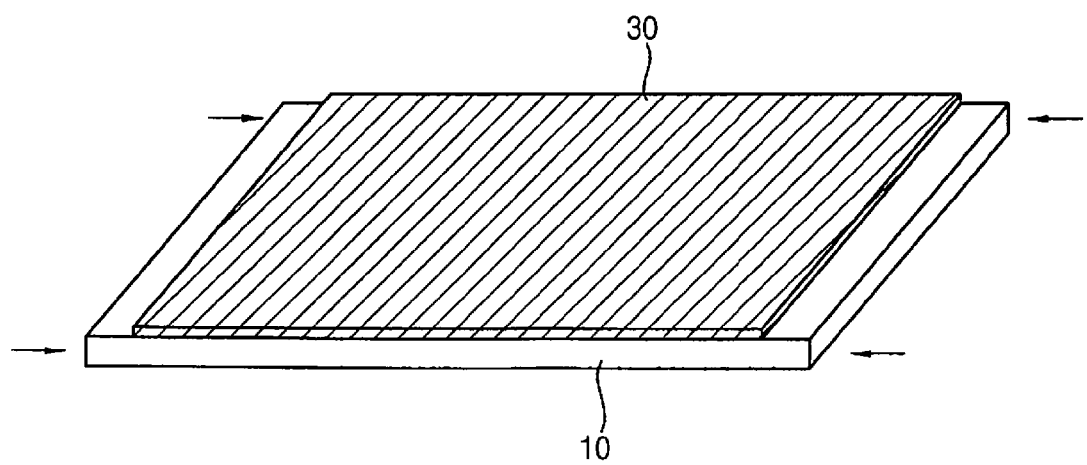
Figure 8:
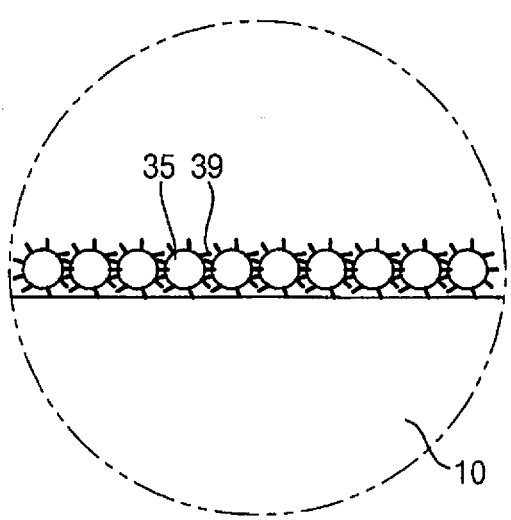

Thereafter, as illustrated in FIG. 7, the elongation apparatus is separated from the substrate 10 to remove the tensile force applied to the substrate 10 (S50). As the tensile force is removed, the substrate 10 contracts. Thus, a gap between the quantum dot particles 35 may be reduced as illustrated in FIG. 8.

As explained in the above, when a gap between quantum dot particles is reduced in the ligand-replacing process and the heating process, the quantum dot particles form groups. A gap between the groups may be a crack in a quantum dot thin film. In an exemplary embodiment, a quantum dot thin film 30 is formed on a substrate to which a tensile force is applied. The tensile force is removed after the ligand-replacing process and the heating process. Thus, a gap between quantum dot groups may be removed. Thus, electrical properties of the quantum dot thin film may be improved.

While a low-temperature heating process is performed before the tensile force to the substrate is removed, the heating process may be omitted in another exemplary embodiment.

In another exemplary embodiment, a ligand-recovery process may be further performed after or before the tensile force to the substrate is removed. When the heating process (S40) is performed, the second ligand of the quantum dot particle may be removed. When the second ligand is removed, the quantum dot particle may be easily removed. Thus, the ligand-recovery process may be performed to encapsulate the substrate. The ligand-recovery process may be performed by providing a ligand material, which is same as the second ligand, to the substrate 10. The ligand material may be provided through a method similar to the ligand-replacing process, for example, a dipping method.

The substrate 10 having the quantum dot thin film 30 may be provided for various electronic elements using a quantum dot thin film, for example, a solar cell or the like. Alternatively, the quantum dot thin film 30 may be separated from the substrate 10, and be combined with a substrate including different materials from the substrate 10, for example, a glass substrate.

The present invention may be used for manufacturing various electronic elements including a transistor, a photovoltaic sensor, a power generation element, a display device, a light source or the like.

The foregoing is illustrative and is not to be construed as limiting thereof. Although a few exemplary embodiments have been described, those skilled in the art will readily appreciate that many modifications are possible in the exemplary embodiments without materially departing from the novel teachings, aspects, and advantages of the invention. Accordingly, all such modifications are intended to be included within the scope of this disclosure.

What is claimed is:

1. A method for manufacturing a quantum dot thin film, the method comprising:
   elongating a substrate by applying a tensile force to the substrate;
   coating quantum dot particles on the substrate to form a layer of quantum dots;
   replacing a first ligand of the quantum dot particles with a second ligand; and
   removing the tensile force from the substrate.

2. The method of claim 1, wherein the substrate includes a polymer.

3. The method of claim 1, wherein the substrate includes polyester terephthalate, polyamide, polydimethyl siloxane, polyester, polyethylene, polypropylene, polyimide, or polyurethane.

4. The method of claim 1, wherein the quantum dot particles include a compound of a Group 13 element and a Group 15 element, a compound of a Group 12 element and a Group 16 element or a compound of a Group 14 element and a Group 16 element.

5. The method of claim 4, wherein the second ligand has fewer carbon atoms than the first ligand.

6. The method of claim 5, wherein the replacing comprises providing alkane thiol, hydrazine or hydroxyl amine to the quantum dot particles.

7. The method of claim 1, wherein the elongating results in an elongation percentage of the substrate is 0.1% to 10%.

8. The method of claim 1, further comprising heating the substrate at 40° C. to 100° C. after the replacing.

* * * * *